(12) United States Patent
Kim et al.

(10) Patent No.: US 6,841,801 B2
(45) Date of Patent: Jan. 11, 2005

(54) MASK FOR CORRECTING OPTICAL PROXIMITY EFFECT

(75) Inventors: Byeong-Soo Kim, Suwon (KR); Han-ku Cho, Sungnam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 183 days.

(21) Appl. No.: 10/106,289

(22) Filed: Mar. 27, 2002

(65) Prior Publication Data

US 2002/0151157 A1 Oct. 17, 2002

(30) Foreign Application Priority Data

Apr. 17, 2001 (KR) .......................................... 2001-20498

(51) Int. Cl.[7] .............................................. H01L 33/00
(52) U.S. Cl. .............................. 257/95; 257/98; 438/22; 438/26
(58) Field of Search .............................. 257/95, 21, 53, 257/184, 209, 436; 438/22, 29, 48

(56) References Cited

U.S. PATENT DOCUMENTS

| | | | |
|---|---|---|---|
| 5,045,417 A | * 9/1991 | Okamoto ........................ | 430/5 |
| 5,478,679 A | * 12/1995 | Loong et al. .................... | 430/5 |
| 5,821,014 A | 10/1998 | Chen et al. | |
| 5,902,752 A | 5/1999 | Sun et al. | |
| 6,355,382 B1 | * 3/2002 | Yasuzato et al. ................ | 430/5 |
| 6,372,392 B1 | * 4/2002 | Hoshino et al. ................ | 430/5 |

FOREIGN PATENT DOCUMENTS

| | | |
|---|---|---|
| JP | 6-59432 | 3/1994 |
| JP | 200003027 | 1/2000 |
| KR | 1019940016571 | 7/1994 |
| KR | 1997-0028798 | 6/1997 |
| KR | 1999-0069739 | 9/1999 |
| KR | P2000-0000592 | 1/2000 |

* cited by examiner

*Primary Examiner*—Dung A. Le
(74) *Attorney, Agent, or Firm*—Volentine Francos & Whitt, PLLC

(57) ABSTRACT

A mask corrects for an optical proximity effect (OPE). A dummy pattern having a phase-edge effect is formed on a mask substrate. The phase-edge effect reduces the intensity of light boundary of two transmitting regions from through transmitted light has a phase difference. A pattern can then be formed in a photolithographic process using the phase-edge effect. A difference between "isolated" and "dense" patterns formed on a wafer can be reduced by forming a dummy pattern in a isolated pattern region of the mask and making the diffraction pattern of the isolated pattern the same as that of the dense pattern, thereby improving the total focus margin. Because the intensity of light is reduced at the boundary between a first region in which the phase of the transmitted light is 0° and a second region in which the phase of the transmitted light is 180°, for example, a photoresist layer is not photosensitized.

11 Claims, 6 Drawing Sheets

MASK FOR CORRECTING OPTICAL PROXIMITY EFFECT

BACKGROUND OF THE INVENTION

1. Field of the Invention

The present invention relates to a semiconductor device and to a method of manufacturing the same. More particularly, the present invention relates to a mask having a dummy pattern for correcting for an optical proximity effect (OPE) occurring when forming fine patterns, and to a method of manufacturing such a mask.

2. Description of the Related Art

One of the problems in forming fine patterns in a semiconductor device having a design rule of less than 180 nm is in securing a focus margin in a photolithography process. In particular, a semiconductor device may have patterns of various line widths and pitches, that is, a region having dense patterns and a region having an isolated pattern may be formed on the same chip. In the case of manufacturing such a semiconductor device, the focus margin for simultaneously forming dense device patterns and an isolated device pattern on a wafer is rather limited due to an optical proximity effect (OPE). The reason for this is that dense patterns and an isolated pattern have different diffraction patterns.

FIG. 1A illustrates a diffraction pattern formed on a projection lens by exposing the projection lens to light transmitted through dense patterns on a mask. In this case, dense patterns having line widths of 0.11 $\mu$m and a pitch of 0.23 $\mu$m are exposed to a KrF light source. The x-axis of the graph denotes the sine of the diffraction angle $\alpha$, and the y-axis denotes the amplitude of the diffracted light. As shown in FIG. 1A, the diffracted light of the dense pattern results in a discontinuous distribution of peaks such as the zero-order maximum, the ± first-order maxima, etc.

On the other hand, FIG. 1B illustrates a diffraction pattern formed on a projection lens by exposing the projection lens to light transmitted through an isolated pattern on a mask. In this case, an isolated pattern having a line width of 0.2 $\mu$m is exposed to a KrF light source. As shown in FIG. 1B, only the zero-order maximum is formed.

If the light having different diffraction patterns is simultaneously projected onto a wafer through the same projection lens to form a device pattern, a difference between "isolated" and "dense" patterns would occur.

To obviate such a problem, a method using a scattering bar has been suggested. A scattering bar is a dummy pattern, finer than a main pattern, and formed on a mask substrate at both sides of isolated patterns. However, the smaller the design rule, that is, the smaller the line width of the patterns, the more difficult it becomes to form a scattering bar having a fine enough line width. Also, manufacturing a mask having a scattering bar is quite difficult because of the strict process conditions required.

Meanwhile, an optimal off-axis exposure method, known as having a high degree of resolution, could be used to form a dense pattern. However, this method only exacerbates the difference between the "isolated" and "dense" patterns. More specifically, in the off-axis exposure method used to produce a dense pattern, the optical axis is not perpendicular to the surface of a wafer, that is, the center of the optical axis is in a region of the dense pattern. As a result, the depth of focus of light on the isolated pattern is relatively small, and thus, the total depth of focus is small.

Depth of focus dictates the line width, i.e., the fineness of the pattern. That is, a pattern having a line width within the depth of focus can be precisely formed. Thus, the larger the depth of focus is, the easier it is to precisely form a pattern, and the smaller the depth of focus is, the more difficult it is to precisely form a pattern.

SUMMARY OF THE INVENTION

Accordingly, it is a first object of the present invention to provide a mask that can produce an isolated pattern using the same diffraction pattern as that of a dense pattern.

It is a second object of the present invention to provide a method of manufacturing such a mask.

To achieve the above-mentioned first object, a mask according to the present invention includes a mask substrate, a main pattern formed on the mask substrate, having an optical transmissivity different from that of the mask substrate, and a plurality of phase shifters formed on the mask substrate at both sides of the main pattern for changing the phase of transmitted exposure light.

Preferably, the main pattern is opaque to the exposure light. The mask substrate may be a binary intensity mask substrate, in which case the main pattern is formed of chromium (Cr). Alternatively, the mask substrate may be a half-tone phase shift mask substrate, in which case the main pattern is formed of molybdenum silicon oxynitride (MoSiON).

The phase shifters may be in the form of lines extending parallel to the main pattern. Alternatively, the phase shifters may have the form of rectangles arrayed in a checkerboard pattern. In either case, the phase of the transmitted light is preferably changed 90° by the phase shifters.

To achieve the above second object, a method for manufacturing a mask generally comprises forming a main pattern on a substrate, and forming a plurality of phase shifters disposed at both sides of the main pattern for changing the phase of transmitted light. The main pattern and phase shifters maybe formed by first forming a shielding layer on the mask substrate, then etching part of the shielding layer until the mask substrate is exposed to thereby form the main pattern, and etching part of the mask substrate to form grooves or recesses at both sides of the main pattern. The phase of the transmitted light is established by the depth of the grooves or recesses. Preferably, the etching of the substrate is carried out to form the phase shifters until the phase of the transmitted light will be changed 90° by the phase shifters.

BRIEF DESCRIPTION OF THE DRAWINGS

The above objects and advantages of the present invention will become more apparent from the following detailed description of the preferred embodiments thereof made with reference to the attached drawings, of which.

DETAILED DESCRIPTION OF THE PREFERRED EMBODIMENTS

Figure 1A:
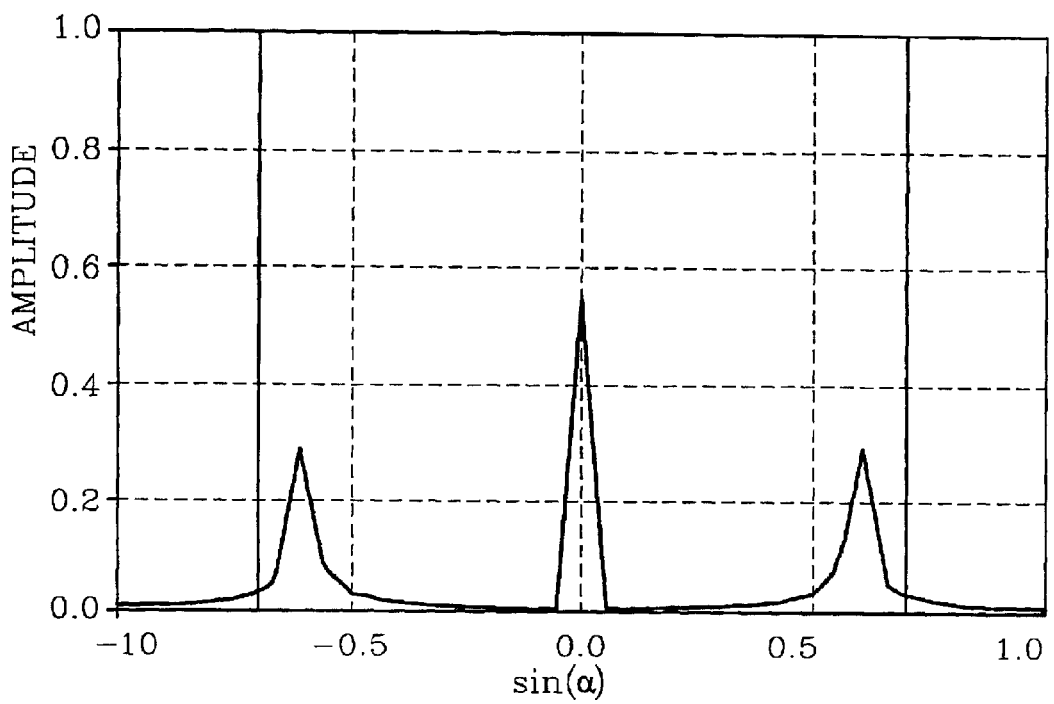
FIGS. 1A and 1B illustrate diffraction patterns on a projection lens exposed to light transmitted through conventional mask patterns.

The present invention will now be described more fully with reference to the accompanying drawings. In the drawings, the forms of elements are exaggerated for clarity. Furthermore, like reference numerals designate like elements throughout the drawings. Also, when one layer is referred to as being on another layer or "on" a semiconductor substrate, such a reference is intended to mean that the one layer may be disposed directly on the other layer or on the semiconductor substrate, or that intermediate layers may be interposed therebetween.

The first embodiment of the mask will now be described with reference to FIGS. 2A through 2C. In general, this mask comprises phase shifters in the form of lines parallel to a main pattern.

Embodiment 1

Figure 2A:
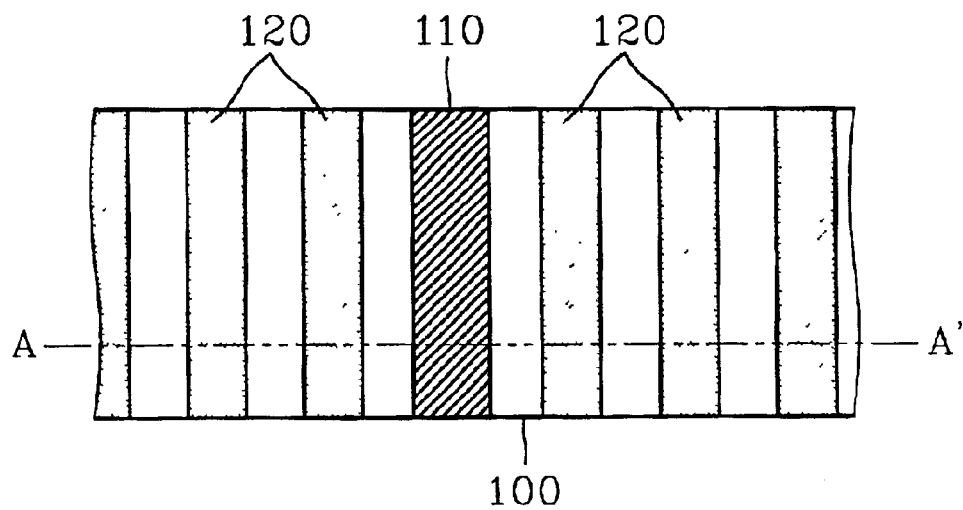
FIG. 2A is a plan view of a first embodiment of a mask according to the present invention.

Referring to FIG. 2A, a main pattern 110 is formed on a mask substrate 100, and line-type dummy phase shifters 120 are formed at both sides of the main pattern 110. The mask substrate 100 transmits light, and the main pattern 110 blocks light. To this end, the mask substrate 100 is formed of quartz, and the main pattern 110 is formed of chromium (Cr). When the mask is exposed to light, the light transmitted through the phase shifters 120 and the light transmitted through a region in which the phase shifters 120 are not formed has a phase difference of 0–180°.

Thus, the intensity of the light transmitted at the boundary between the mask substrate 100 and the phase shifters 120 is reduced. That is, a plurality of the phase shifters 120 are defined on the mask substrate 100 alternately with the regions in which no pattern is formed. Thus, each boundary line between such a region on the mask substrate 100 and a phase shifter 120 serves as a dummy pattern. As a result, the isolated pattern region can produce a diffraction pattern that is the same as that of the dense pattern region. In this embodiment, the line width of the main pattern 110, the width of the phase shifters 120, and the distance between the phase shifters 120 are all 0.2 μm.

The phase shifters 120 of FIG. 2A can be formed by two methods, as described later on. These two methods include a method in which the mask substrate 100 is etched to form the phase shifters 120, and a method in which the phase shifters 120 are formed on the mask substrate 100. FIG. 2B illustrates the case in which phase shifters 120 are formed by etching the mask substrate 100.

Figure 2B:
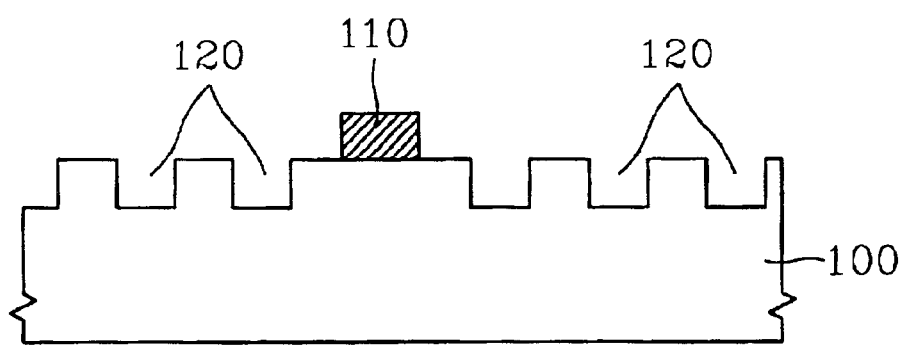
FIG. 2B is a sectional view taken along line A–A' of FIG. 2A.

Referring to FIG. 2B, grooves acting as phase shifters 120 are formed in the surface of a mask substrate 100 at regular intervals at both sides of a main pattern 110. Thus, the thickness of the mask substrate 100 differs amongst the region in which the grooves are formed and the region in which the grooves are not formed. Accordingly, when the mask substrate 100 is exposed, light transmitted through the region in which the grooves are formed and light transmitted through the region in which the grooves are not formed travel different distances through the medium of the substrate 100, whereby a phase difference is observed in the light at the boundary between these regions. In other words, as mentioned above, the boundary serves as a dummy pattern to create the phase difference. The magnitude of the phase difference is dictated by the depth of the grooves, that is, the depth of the phase shifters 120.

In the embodiment described above, the phase shifters 120 are designed to produce a phase difference of 90°. Unnecessary patterns, excluding the main pattern required for the semiconductor device, must not be formed on a wafer. The phase difference produced by the phase shifters 120 can be pre-established so that dummy patterns are not formed on a wafer.

Figure 2C:
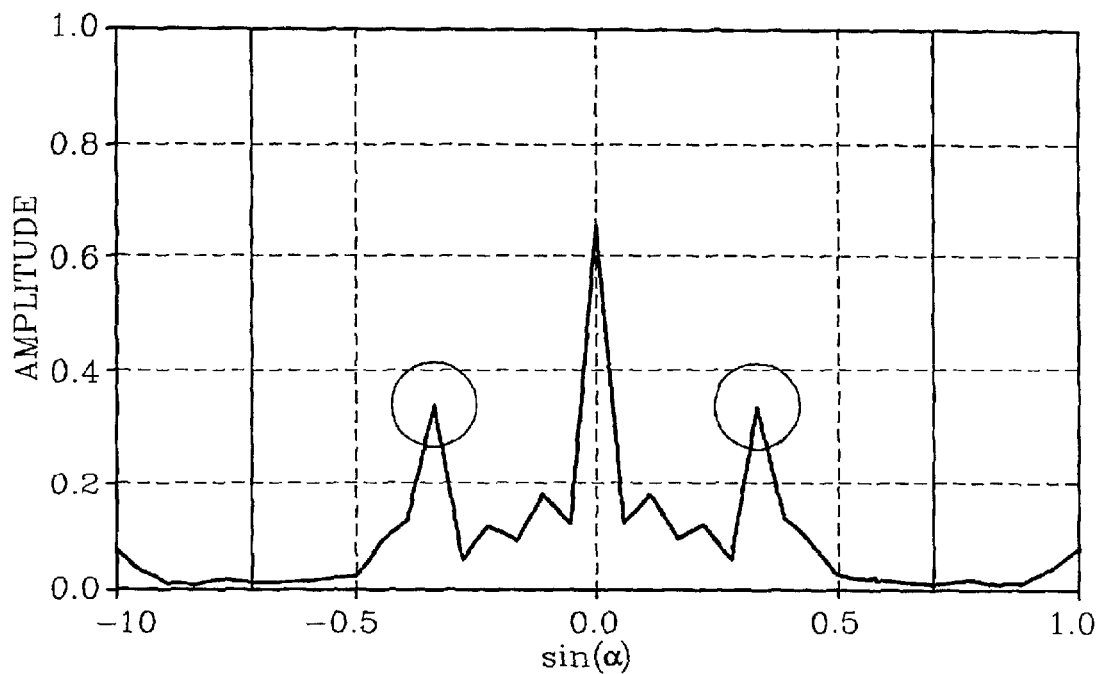
FIG. 2C illustrates a diffraction pattern formed on a projection lens exposed to light transmitted through the first embodiment of the mask pattern according to present invention.

FIG. 2C illustrates the diffraction pattern formed on a projection lens by light transmitted through the first embodiment of the mask pattern described with reference to FIGS. 2A and 2B. As is clear from FIG. 2C, the diffraction pattern is in the form of a discontinuous distribution of peaks such as the zero-order maximum, ± the first-order maxima, etc., similar to the diffraction pattern shown in FIG. 1A. As a result, the shape of diffracted light of the isolated pattern is similar to that of a dense pattern. Note, the spacing between the zero-order maximum and ± the first-order maxima can be established by appropriate design selection of the line width of the main pattern and the phase shifters or the spacing between the main pattern and the phase shifters.

Figure 3A:
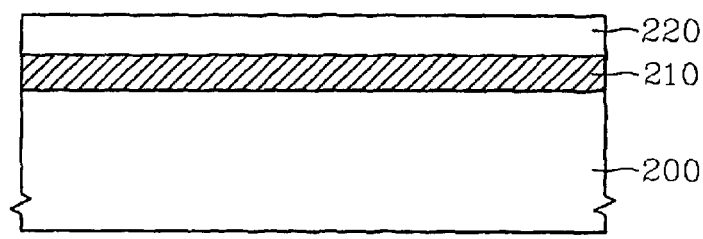
FIGS. 3A through 3D are sectional views illustrating a method of manufacturing the first embodiment of the mask, according to present invention.

Next, a method of manufacturing the mask will be described with reference to FIGS. 3A through 3D. Referring first to FIG. 3A, a shielding layer 210 and a first photoresist layer 220 are sequentially formed on a quartz mask substrate 200. The shielding layer 210 is formed of chromium (Cr).

Figure 3B:
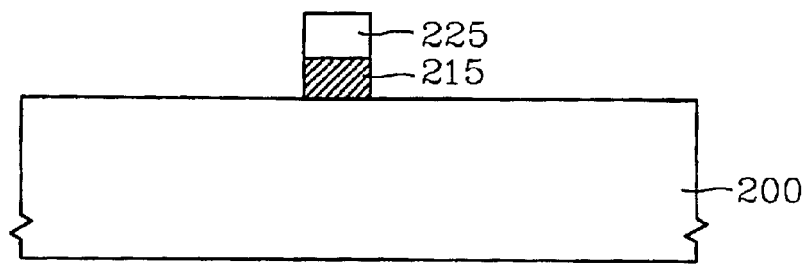

Referring to FIG. 3B, the first photoresist layer 220 is developed to form a first photoresist pattern 225, and the shielding layer 210 is etched until the mask substrate 200 is exposed to form a main pattern 215.

Figure 3C:
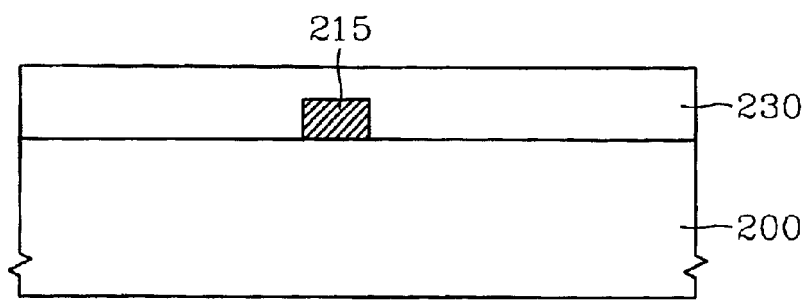

Referring to FIG. 3C, a second photoresist layer 230 is formed on the entire surface of the mask substrate 200, including over the main pattern 215.

Figure 3D:
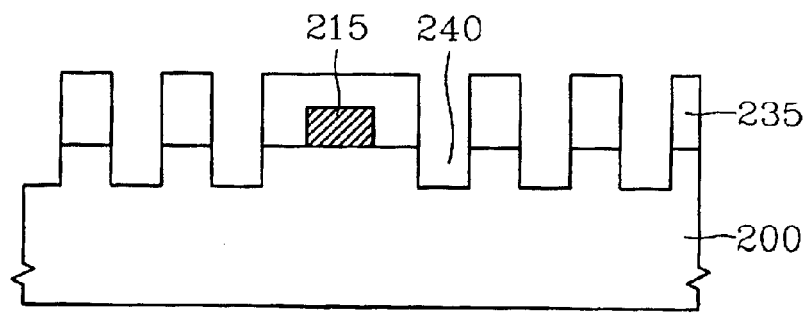

Referring to FIG. 3D, the second photoresist layer 230 is developed to form a second photoresist pattern 235, and the surface of the mask substrate 200 is etched to form a plurality of grooves acting as phase shifters 240 spaced regularly from one another. Next, the second photoresist pattern 235 is removed, thereby completing the method of forming the mask.

Hereinafter, a second embodiment will be described with reference to FIG. 4. In general, the second embodiment comprises phase shifters arranged in checkerboard patterns at both sides of the isolated main pattern.

Embodiment 2

Figure 4:
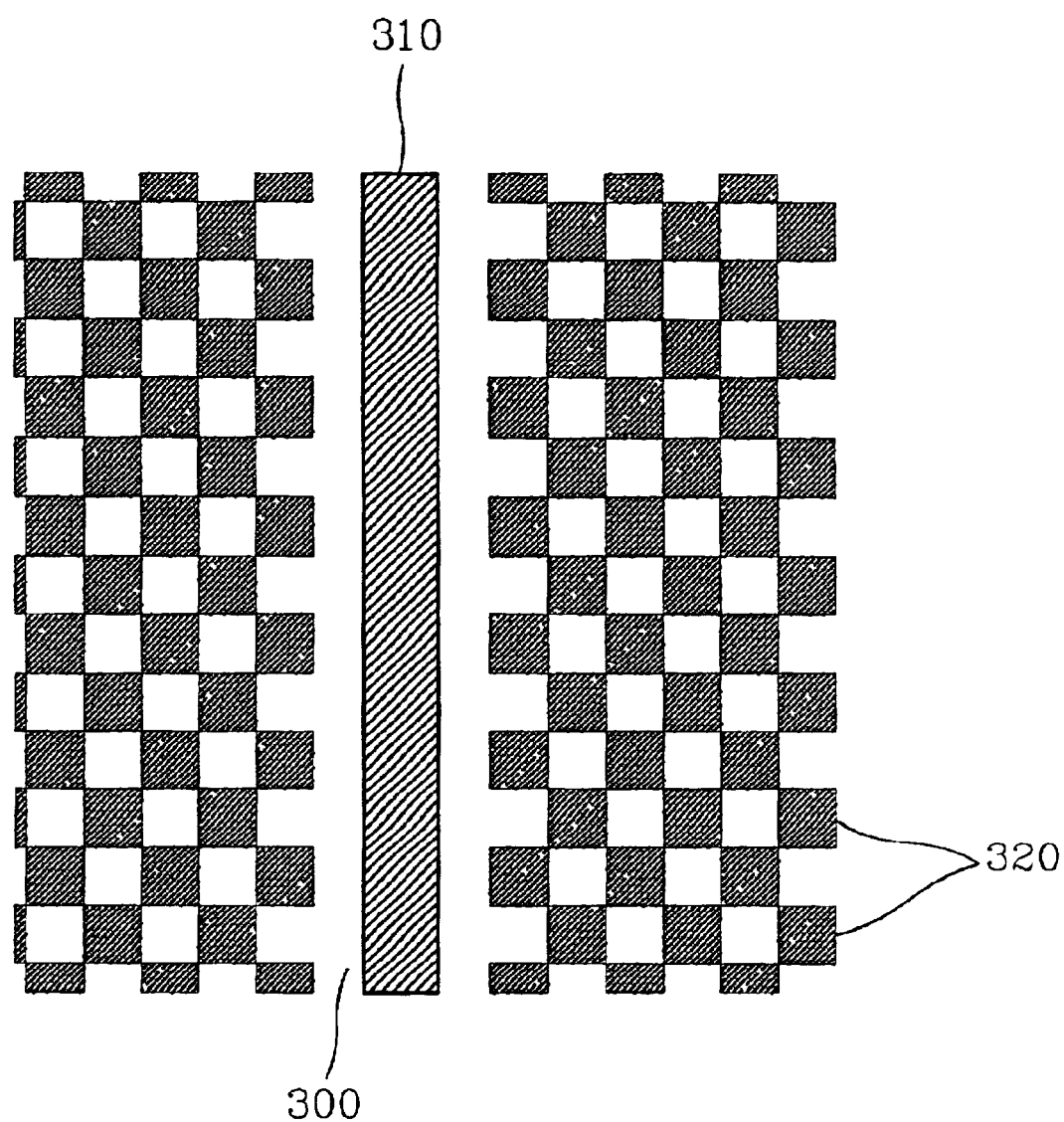
FIG. 4 is a plan view of a second embodiment of a mask according to the present invention.

Referring to FIG. 4, a main pattern 310 is formed on a mask substrate 300. A plurality of rectangular phase shifters 320 are formed at both sides of the main pattern 310 and are arrayed in orthogonal directions. In other words, a plurality of phase shifters 320 are formed as rectangles constituting a checkerboard pattern. Because the boundary between the phase shifters 320 and the region of the mask substrate 300 in which the phase shifters 320 are not formed serves as a dummy pattern, a checkerboard dummy pattern is formed.

In this embodiment as well, the line width of the main pattern 310 and the width of the phase shifters 320 are both 0.2 μm. The distance between the main pattern 310 and an arrangement region of the phase shifters 320 is 0.15 μm. Furthermore, the phase difference of the transmission light is 90°, as in the first embodiment.

The second embodiment of the mask according to the present invention can be used to form a pattern which extends in two orthogonal horizontal directions. On the other hand, the first embodiment of the mask according to the present invention can be used to form a main line pattern extending in only one direction. Note, also, that the second embodiment of the mask according to the present invention can be formed by methods similar to those described in connection with the first embodiment. Therefore, a detailed description of the methods of forming the second embodiment of the mask will be omitted for the sake of brevity.

Figure 1B:
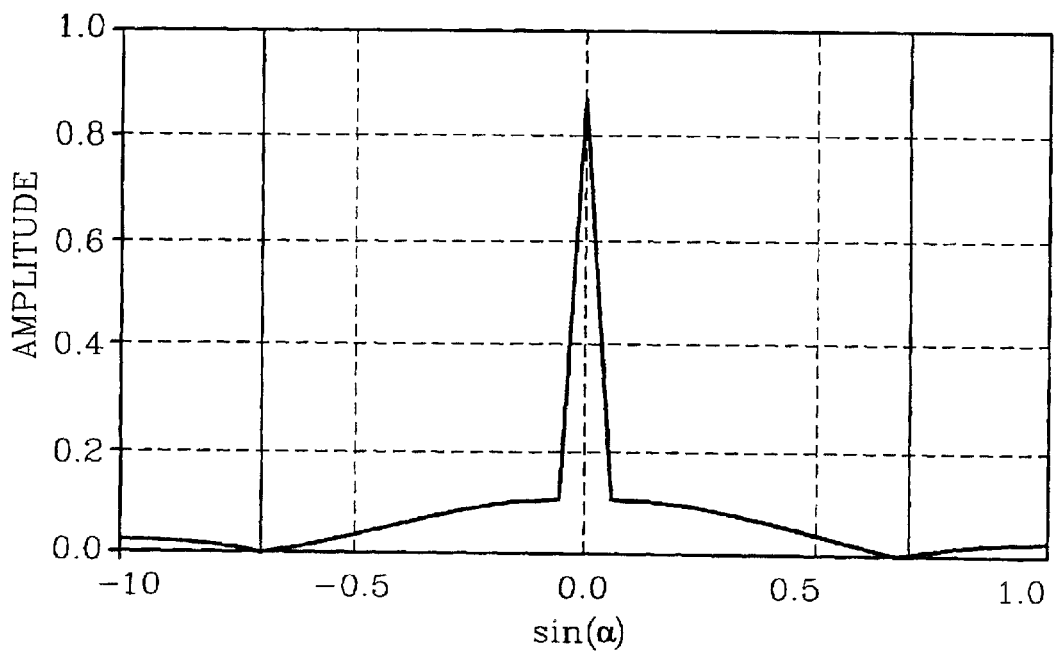
Figure 5:
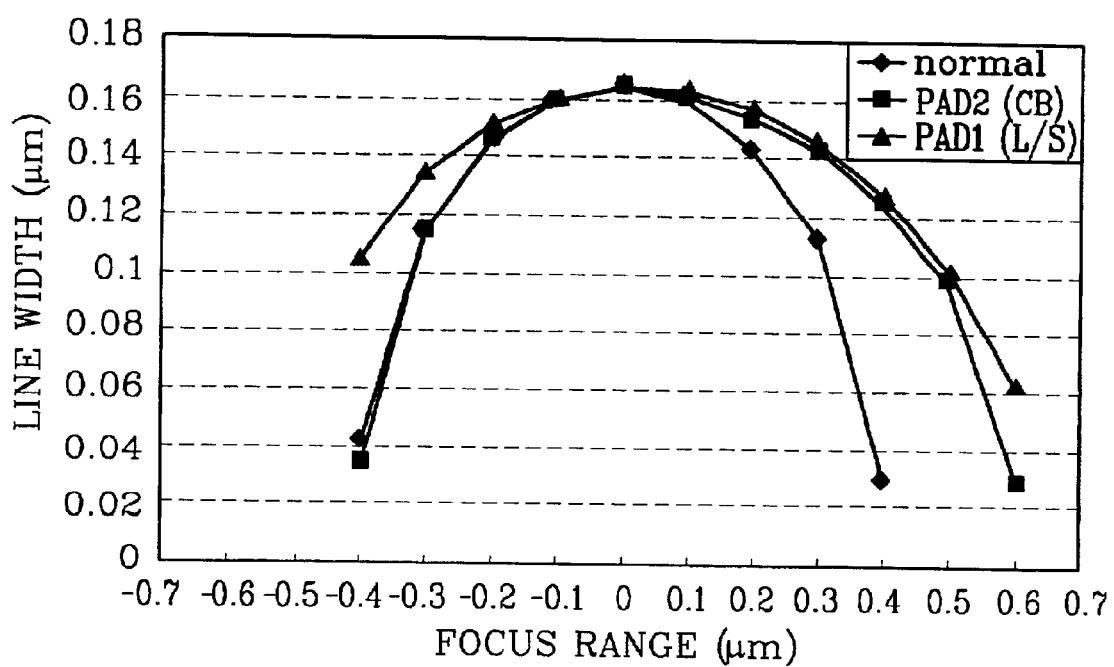
FIG. 5 illustrates the results of a computer simulation of change in depth of focus with respect to change in line width of a pattern using a mask according to the present invention.

FIG. 5 illustrates a computer simulation of change in depth of focus with respect to change in line width of a pattern using a mask according to the present invention. Referring to FIG. 5, the curve designated 'normal' depicts the pattern shown in FIG. 1B. The curve designated 'PAD1' depicts a pattern that would be formed using phase shifters of the first embodiment, and the curve 'PAD2' the pattern that would be formed using phase shifters of the second embodiment. As shown in the figure, as the line width of the pattern decreases, the depth of focus range for 'PAD1' and 'PAD2' becomes wider than that for 'normal'.

As described above, according to the present invention, a mask is formed so that the isolated pattern and the dense pattern produce the same diffraction pattern, thereby reducing the difference between "isolated" and "dense" patterns, i.e., correcting for an optical proximity effect (OPE). Thus, a wider focus margin is secured. Also, the boundary between a region of the mask substrate itself and the phase shifters forms the dummy pattern. The present invention thus offers a method of forming a fine dummy pattern that is much easier to execute than the prior art method of forming a scattering bar.

Finally, although the present invention has been described above in connection with the preferred embodiments thereof, the invention may, however, be embodied in many other forms and should not be construed as being limited to the embodiments described in detail hereinabove. Rather, all such other forms of the present invention, as defined by the appended claims, are within the true spirit and scope of the present invention.

What is claimed is:

1. A mask for use in forming a pattern on a substrate, comprising:

a mask substrate having a transparency to an exposure light;

a layer of material having an optical transmissivity that is less than that of said mask substrate with respect to the exposure light, said layer of material only existing on the mask substrate at a central region of the mask substrate to thereby form a main pattern, wherein no other material having said optical transmissivity is present on said mask substrate; and a plurality of phase shifters disposed on each side of the main pattern at first transmitting regions of the mask, respectively, said phase shifters being transparent to said exposure light, and the mask having a plurality of second transmitting regions at each side of the main pattern, the mask being transparent to said exposure light at said second transmitting regions, respective ones of said phase shifters being alternately disposed, in at least one of two orthogonal directions, with respective ones of said second transmitting regions on each side of the main pattern, the thickness of the mask at said phase shifters being different from the thickness of the mask substrate at said second transmitting regions, whereby when the exposure light is transmitted through the mask, light is blocked by said main pattern for use in forming an isolated pattern on a substrate and the light transmitted through said first and second transmitting regions will have a phase difference such that a diffraction pattern is produced.

2. The mask as claimed in claim 1, wherein said main pattern is opaque with respect to the exposure light.

3. The mask as claimed in claim 1, wherein said main pattern is a linear pattern, and said phase shifters and said second transmitting regions are in the form of lines extending parallel to the main pattern such that respective ones of said phase shifters are alternately disposed in only one direction with respective ones of said second transmitting regions on each side of the main pattern.

4. The mask as claimed in claim 1, wherein said phase shifters and said second transmitting regions are rectangular and are arranged in a checkerboard pattern such that respective ones of said phase shifters are alternately disposed in both of said orthogonal directions with respective ones of said second transmitting regions on each side of the main pattern.

5. The mask as claimed in claim 3, wherein the phase shifters are grooves in said mask substrate.

6. The mask as claimed in claim 4, wherein the phase shifters are rectangular recesses in said mask substrate.

7. The mask as claimed in claim 1, wherein the phase difference produced by said phase shifters is 90° with respect to light transmitted through said second transmitting regions.

8. The mask as claimed in claim 1, wherein the mask substrate is a binary intensity mask substrate, and said layer of material constituting the main pattern is chromium (Cr).

9. The mask as claimed in claim 1, wherein the mask substrate is a half-tone phase shift mask substrate, and said layer of material constituting the main pattern is molybdenum silicon oxynitride (MoSiON).

10. The mask as claimed in claim 1, wherein the widths of said phase shifters and the distances between adjacent ones of the phase shifters on each side of the main pattern are all equal as taken in said first direction.

11. The mask as claimed in claim 1, wherein the line width of said main pattern, the widths of said phase shifters and the distances between adjacent ones of the phase shifters on each side of the main pattern are all equal as taken in said first direction.

* * * * *